US010326001B2

United States Patent
Chao et al.

(10) Patent No.: US 10,326,001 B2
(45) Date of Patent: Jun. 18, 2019

(54) SELF-LIMITED INNER SPACER FORMATION FOR GATE-ALL-AROUND FIELD EFFECT TRANSISTORS

(71) Applicant: INTERNATIONAL BUSINESS MACHINES CORPORATION, Armonk, NY (US)

(72) Inventors: Robinhsinku Chao, Cohoes, NY (US); ChoongHyun Lee, Rensselaer, NY (US); Heng Wu, Altamont, NY (US); Chun W. Yeung, Niskayuna, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/692,294

(22) Filed: Aug. 31, 2017

(65) Prior Publication Data

US 2018/0212038 A1    Jul. 26, 2018

Related U.S. Application Data

(62) Division of application No. 15/416,566, filed on Jan. 26, 2017, now Pat. No. 9,947,767.

(51) Int. Cl.
*H01L 29/66* (2006.01)
*H01L 21/324* (2006.01)
(Continued)

(52) U.S. Cl.
CPC .. *H01L 29/66553* (2013.01); *H01L 21/02247* (2013.01); *H01L 21/324* (2013.01);
(Continued)

(58) Field of Classification Search
CPC .......... H01L 29/0673; H01L 29/42392; H01L 29/66795; H01L 29/66545;
(Continued)

(56) References Cited

U.S. PATENT DOCUMENTS

| 6,444,516 B1* | 9/2002 | Clevenger ......... H01L 21/28044 |
|---|---|---|
| | | 257/E21.198 |
| 6,930,362 B1* | 8/2005 | Mirabedini ........... H01L 21/265 |
| | | 257/412 |

(Continued)

OTHER PUBLICATIONS

List of IBM Patents or Patent Applications Treated as Related dated Aug. 31, 2017, 2 pages.

(Continued)

*Primary Examiner* — Khiem D Nguyen
(74) *Attorney, Agent, or Firm* — Tutunjian & Bitetto, P.C.; Vazken Alexanian

(57) ABSTRACT

A semiconductor devices and methods of forming the same include forming a layer of activating material on sidewalls of a stack of alternating layers of channel material and sacrificial material. The layer of activating material is annealed to cause the activating material to react with the sacrificial material and to form insulating spacers at ends of the layers of sacrificial material. The layer of activating material is etched away to expose ends of the layers of channel material. Source/drain regions are formed on the ends of the layers of channel material.

20 Claims, 5 Drawing Sheets

(51) Int. Cl.
*H01L 21/02* (2006.01)
*H01L 29/06* (2006.01)
*H01L 29/423* (2006.01)
*H01L 29/786* (2006.01)

(52) U.S. Cl.
CPC .... *H01L 29/0673* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ............. H01L 29/78696; H01L 29/785; H01L 21/02532; H01L 21/0245; H01L 27/0886; H01L 29/6656; H01L 27/1203; H01L 29/66439; H01L 29/775; H01L 21/02603
See application file for complete search history.

(56) References Cited

U.S. PATENT DOCUMENTS

| | | | |
|---|---|---|---|
| 7,091,567 B2 * | 8/2006 | Park | H01L 29/4983 257/408 |
| 7,888,264 B2 * | 2/2011 | Chan | H01L 29/66507 257/E21.438 |
| 8,778,768 B1 * | 7/2014 | Chang | H01L 29/42392 257/213 |
| 9,362,355 B1 * | 6/2016 | Cheng | H01L 29/66742 |
| 9,653,289 B1 | 5/2017 | Balakrishnan et al. | |
| 9,704,863 B1 * | 7/2017 | Cheng | H01L 27/092 |
| 9,947,767 B1 | 4/2018 | Chao et al. | |
| 2011/0147711 A1 * | 6/2011 | Pillarisetty | B82Y 10/00 257/24 |
| 2015/0221676 A1 | 8/2015 | Holt et al. | |
| 2015/0380481 A1 | 12/2015 | Cappellani et al. | |
| 2016/0020305 A1 | 1/2016 | Obradovic et al. | |
| 2016/0027870 A1 | 1/2016 | Cheng et al. | |
| 2016/0225766 A1 | 8/2016 | Cheng et al. | |
| 2016/0365440 A1 * | 12/2016 | Suk | H01L 29/785 |

OTHER PUBLICATIONS

Sheng Kai Wang et al., Desorption kinetics of GeO from GeO 2 / Ge structure, Journal of Applied Physics 108, Sep. 2010.
Office Action for U.S. Appl. No. 15/835,925 dated Apr. 6, 2018 (29 pages).
Office Action for U.S. Appl. No. 15/835,925 dated Nov. 8, 2018 (25 pages).

* cited by examiner

SELF-LIMITED INNER SPACER FORMATION FOR GATE-ALL-AROUND FIELD EFFECT TRANSISTORS

BACKGROUND

Technical Field

The present invention generally relates to field effect transistors and, more particularly, to the fabrication of planar field effect transistors that have inner spacers and no substrate channel path.

Description of the Related Art

A gate-all-around field effect transistor (FET) design can provide a high degree of electro-static control to help scale devices to ever-smaller dimensions. However, forming such devices on bulk semiconductor substrates shows short-channel effects. In addition, parasitic capacitance becomes a significant design difficulty.

In particular, when forming a gate-all-around FET, a stack of channel structures may be formed, but the underlying substrate can create a short-circuit between source/drain regions when the structures are very small. This causes the FET to perform poorly, with large currents even when the device is not turned on.

SUMMARY

A method of forming a semiconductor device includes forming a layer of activating material on sidewalls of a stack of alternating layers of channel material and sacrificial material. The layer of activating material is annealed to cause the activating material to react with the sacrificial material and to form insulating spacers at ends of the layers of sacrificial material. The layer of activating material is etched away to expose ends of the layers of channel material. Source/drain regions are formed on the ends of the layers of channel material.

A method of forming a semiconductor device includes etching down source and drain regions of a stack of alternating layers of channel material and sacrificial material, leaving a portion of a bottommost layer of sacrificial material remaining. A layer of activating material is formed on sidewalls of the stack of alternating layers. The layer of activating material is annealed to cause the activating material to react with the sacrificial material and to form insulating spacers at ends of the layers of sacrificial material and to form lower barriers from the remaining portion of the bottommost layer of sacrificial material. The insulating spacers are nitridated. The layer of activating material is etched away to expose ends of the layers of channel material. Source/drain regions are formed on the ends of the layers of channel material.

A semiconductor device includes a stack of vertically aligned semiconductor channel layers above a substrate. A gate stack is formed on, around, and between the vertically aligned semiconductor channel layers. Source and drain structures are formed in contact with respective sidewalls of each of the vertically aligned semiconductor channel layers. Inner spacers are positioned between the vertically aligned semiconductor channel layers and in contact with the source and drain structures. Lower insulating barriers are positioned between the substrate and the respective source and drain structures.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide gate-all-around field effect transistors (FETs) that include inner spacers using a self-limiting formation process. The present embodiments further provide an insulator layer on the surface of the substrate underneath the channel(s), preventing the substrate from conducting electricity between the source and drain.

Figure 1:
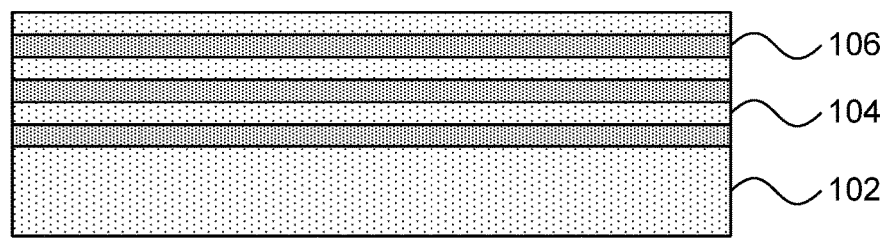
FIG. 1 is a cross-sectional view of a step in the formation of a gate-all-around field effect transistor (FET) that inhibits short channel effects in accordance with an embodiment of the present invention.

Referring now to the drawings in which like numerals represent the same or similar elements and initially to FIG. 1, a step in the formation of a FET is shown. A semiconductor substrate 102 is layered with alternating layers of channel material 104 and sacrificial material 106. The semiconductor substrate 102 may be a bulk-semiconductor substrate. It should be understood that the stack of channel layers 104 and sacrificial layers 106 can be sectioned into device regions, although only one such device region is shown herein. It is specifically contemplated that the alternating layers of channel material 104 and sacrificial material 106 are formed as sheets of material. It should be understood that, although nanosheet structures are handled specifically herein, the present embodiments may be applied to create nanowire or other structures as well.

In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It is specifically contemplated that the alternating layers 104 and 106 are formed from different materials. In one particular embodiment, the layers of channel material 104 may be formed from, e.g., a silicon-containing semiconductor, with silicon itself being specifically contemplated, and the layers of sacrificial material may be formed from a silicon germanium composite, with germanium forming, e.g., about 50% of the sacrificial material. In one particular embodiment, the layers of channel material 104 may be about 9 nm thick and the layers of sacrificial material may be about 12 nm thick, but it should be understood that other thicknesses may be used in accordance with design needs and fabrication process limitations.

The layers of channel material and sacrificial material 104 and 106 may be formed on the substrate 102 by any appropriate deposition process. For example, the alternating layers may be formed by alternating deposition processes including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
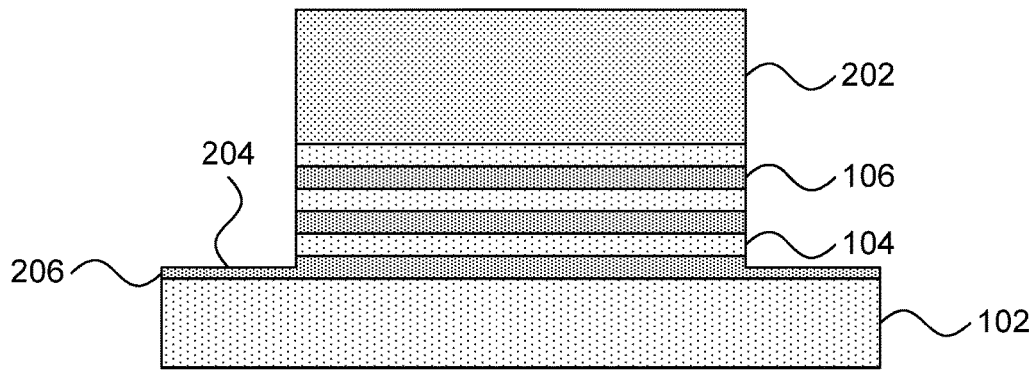
FIG. 2 is a cross-sectional view of a step in the formation of a gate-all-around FET that inhibits short channel effects in accordance with an embodiment of the present invention.

Referring now to FIG. 2, a step in the formation of a FET is shown. A dummy gate 202 or other sacrificial structure is formed over the stack of alternating layers. It is specifically contemplated that the dummy gate 202. It is specifically contemplated that the dummy gate 202 may be formed from any material that is selectively etchable with respect to the top layer of channel material.

After formation of the dummy gate 202, the stack of alternating layers is etched down in regions not covered by the dummy gate 202. This etch can be performed using a timed anisotropic etch such as reactive ion etching (RIE). The etch can be performed in a single etch that removes material from both the channel layers 104 and the sacrificial layers 106 or may, alternatively, be performed using alternating etching processes that selectively affect the channel layers 104 and the sacrificial layers 106 in turn. The etch is performed such that a lowest sacrificial layer 206 is only partially etched, leaving a layer of sacrificial material in the etched source/drain regions 204. As used herein, the term "selective" in reference to a material removal process denotes that the rate of material removal for a first material is greater than the rate of removal for at least another material of the structure to which the material removal process is being applied.

Figure 3:
FIG. 3 is a cross-sectional view of a step in the formation of a gate-all-around FET that inhibits short channel effects in accordance with an embodiment of the present invention.

Referring now to FIG. 3, a step in the formation of a FET is shown. A layer of activating material 302 is deposited using, e.g., a conformal deposition process to cover the sidewalls of the sack of channel material 104 and sacrificial material 106. It is specifically contemplated that the activating material 302 may be formed from, e.g., germanium dioxide and may be deposited using ALD, but it should be understood that alternative deposition processes may be used instead. In one particular embodiment, the activating material 302 may be deposited to a thickness of about 5 nm, but it should be understood that this thickness may be increased or decreased in accordance with the thickness of the inner spacers needed.

Figure 4:
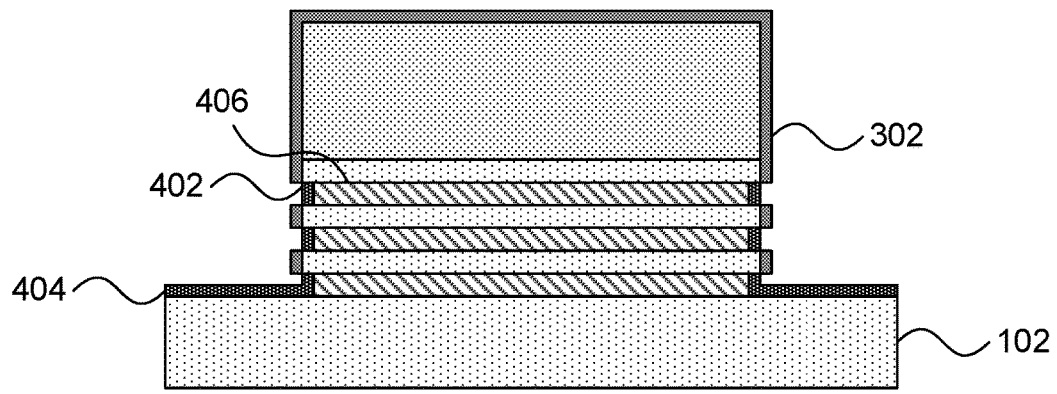
FIG. 4 is a cross-sectional view of a step in the formation of a gate-all-around FET that inhibits short channel effects in accordance with an embodiment of the present invention.

Referring now to FIG. 4, a step in the formation of a FET is shown. An anneal is performed that causes the layer of activating material 302 in contact with the layers of sacrificial material 106 to interact. It is specifically contemplated that the anneal may be performed at about 700° C. for about 30 seconds.

During the anneal, the activating material 302 that is in contact with the layers of channel material 104 does not react with the channel material. For the activating material 302 that is in contact with the sacrificial material, a chemical reaction occurs to form insulating spacer material 402 at the exposed portions of the layers of sacrificial material 106. This includes the formation of barriers 404 from the source/drain sacrificial material 206.

In one specific embodiment, where the sacrificial material 104 is silicon germanium (with a starting germanium concentration of 50%) and where the activating material 302 is germanium dioxide, the chemical reaction is:

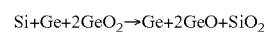

$$Si + Ge + 2GeO_2 \rightarrow Ge + 2GeO + SiO_2$$

GeO is a volatile species and escapes as a gas. The free germanium migrates inward and increases the germanium concentration in the layers of sacrificial material 406 to, e.g., about 70%. The silicon dioxide is formed at the edges of the layers of sacrificial material 406, forming the insulating spacer material 402.

In the specific embodiment where the activating material 302 is formed to a thickness of about 5 nm, the insulating spacer material 402 penetrates into the layers of sacrificial material 406 to a depth of about 5 nm. The depth is self-limiting because it is controlled by the amount of activating material 302 that is present. In addition, the insulating spacer material 402 is formed with a sharp, rectangular boundary.

Figure 5:
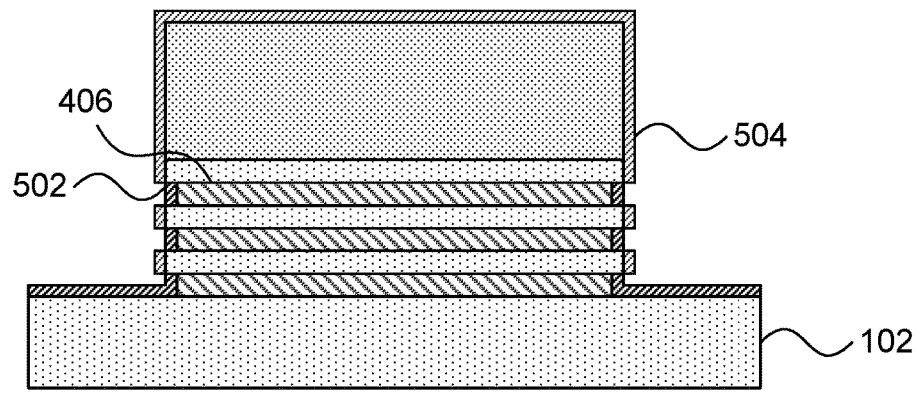
FIG. 5 is a cross-sectional view of a step in the formation of a gate-all-around FET that inhibits short channel effects in accordance with an embodiment of the present invention.

Referring now to FIG. 5, a step in the formation of a FET is shown. The insulating spacer material 402 and the barriers 404 are nitridated. In the specific embodiment where the insulating spacer material 402 and the barriers 404 are formed from silicon dioxide, the nitridation process converts these structures to silicon oxynitride. In particular, inner spacers 502 are formed. During the nitridation process, the remaining activating material 302 is also nitridated, leaving a layer of nitridated material 504. In the case of an activating material 302 that is formed from germanium dioxide, the layer of nitridated material 504 is formed from germanium oxynitride.

Figure 6:
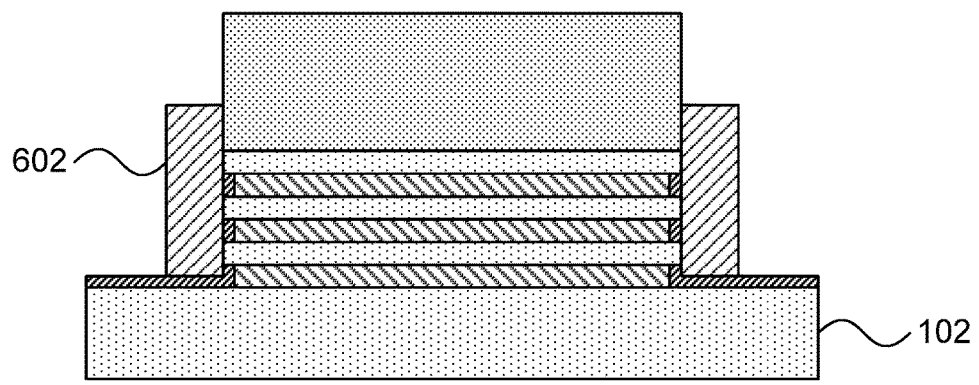
FIG. 6 is a cross-sectional view of a step in the formation of a gate-all-around FET that inhibits short channel effects in accordance with an embodiment of the present invention.

Referring now to FIG. 6, a step in the formation of a FET is shown. The remaining nitridated material 504 is etched away using any appropriate selective etch such as, e.g., a wet or dry chemical etch that does not affect the channel material 102 or the inner spacers 502. This etch exposes the sides of the layers of channel material 104.

Source/drain regions 602 are epitaxially grown from the exposed ends of the layers of channel material 104. It should be noted that the source/drain regions are prevented from contacting the substrate 102 by the underlying barriers. This prevents the substrate 102 from acting as a short-channel, reducing the leakage current of the device in operation.

The term "epitaxial growth" herein refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. After growth, the source/drain regions 602 may be trimmed to an appropriate shape and size.

In the present embodiments, the source/drain regions 602 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous.

Figure 7:
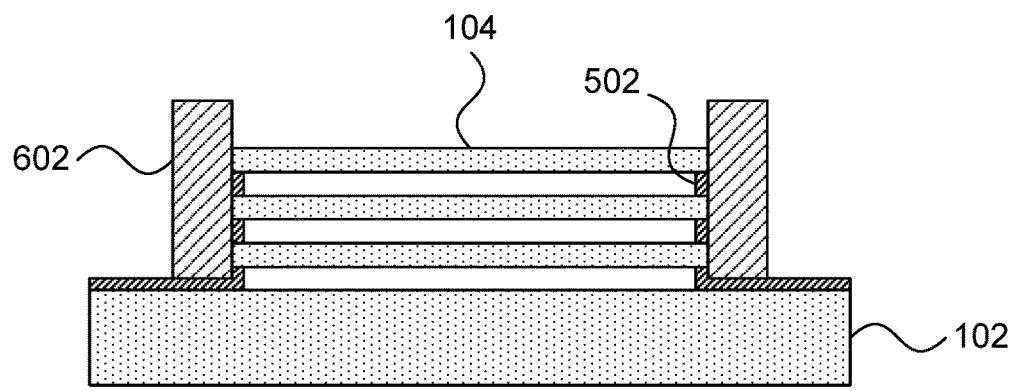
FIG. 7 is a cross-sectional view of a step in the formation of a gate-all-around FET that inhibits short channel effects in accordance with an embodiment of the present invention.

Referring now to FIG. 7, a step in the formation of a FET is shown. The dummy gate 202 and the layers of concentrated sacrificial material 406 are etched away, leaving the layers of channel material 104 suspended between the source/drain regions 602. The inner spacers 502 remain as well. It is specifically contemplated that the etch of the concentrated sacrificial material 406 may be performed using an isotropic etch such as, e.g., a wet or dry chemical etch that is selective to the concentrated sacrificial material 406. In one specific embodiment, the removal of the sacrificial material leaves gaps that are, e.g., about 12 nm high between the layers of channel material 104.

Figure 8:
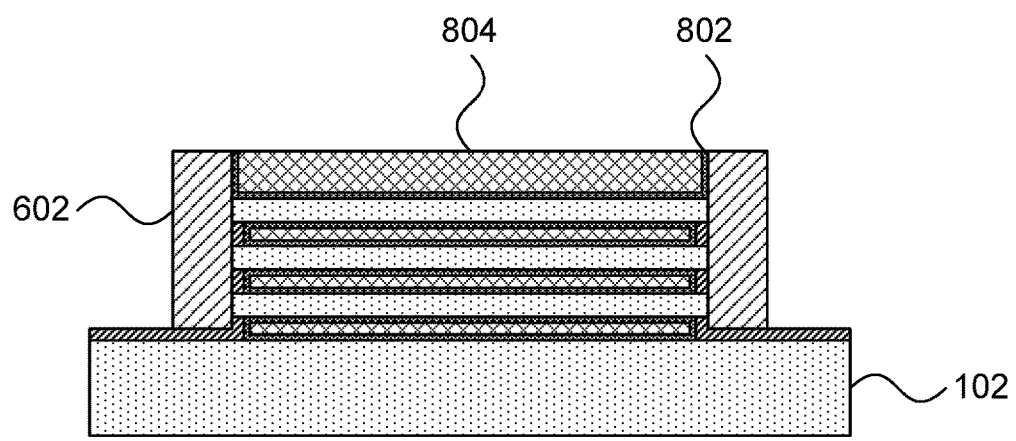
FIG. 8 is a cross-sectional view of a step in the formation of a gate-all-around FET that inhibits short channel effects in accordance with an embodiment of the present invention.

Referring now to FIG. 8, a step in the formation of a FET is shown. A gate stack is formed by, e.g., conformally forming a gate dielectric layer 802 followed by a gate 804. The gate dielectric layer 802 may be formed from any appropriate dielectric material, but it is specifically contemplated that high-k dielectric materials may be used.

As used herein, "high-k" denotes a dielectric material featuring a dielectric constant (k) higher than the dielectric constant of silicon dioxide. The high-k gate dielectric layer 15 can include at least one metallic element. Some examples of high-k dielectric materials suitable for the gate dielectric layer 802 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one embodiment, the gate dielectric layer 802 has a thickness that ranges from about 1 nm to about 10 nm. In another embodiment, the gate dielectric layer 802 has a thickness that ranges from about 1 nm to about 4 nm.

The gate 804 itself is formed from a conductive material. Exemplary materials that may be used for the gate 804 include, metals, such as tungsten, nickel, titanium, molybdenum, tantalum, copper, platinum, silver, gold, ruthium, iridium, rhenium, and rhodium and alloys thereof, and doped semiconductor materials such as, e.g., doped polysilicon.

Figure 9:
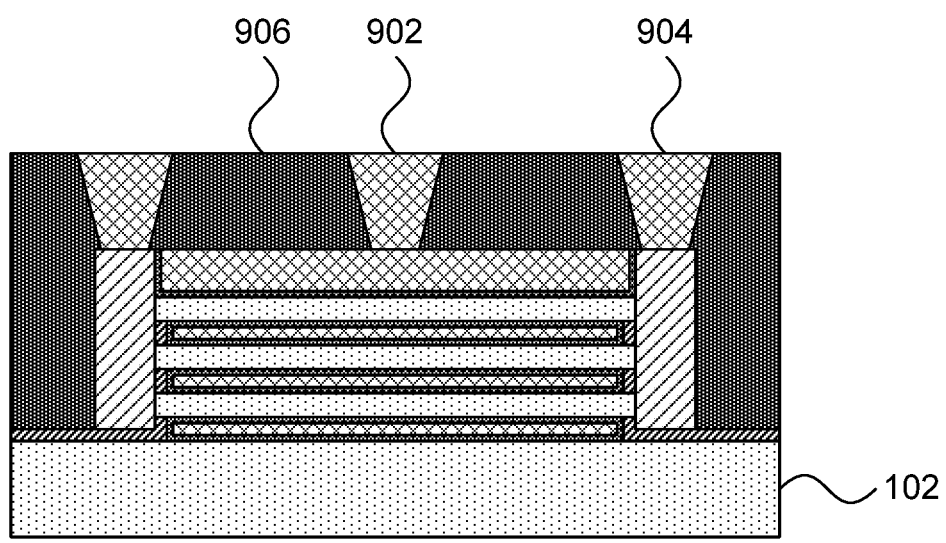
FIG. 9 is a cross-sectional view of a step in the formation of a gate-all-around FET that inhibits short channel effects in accordance with an embodiment of the present invention.

Referring now to FIG. 9, a step in the formation of a FET is shown. A layer of passivating dielectric 906 (or inter-layer dielectric) is deposited over the device structure. It is specifically contemplated that the passivating dielectric 906 may be, e.g., silicon dioxide, but any other appropriate dielectric material may be used instead. Openings in the passivating dielectric 906 are formed using, for example, any appropriate anisotropic etch. Gate contacts 902 and source/drain contacts 904 are then formed in the openings to provide electrical connectivity to the gate 802 and to the source/drain regions 602.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
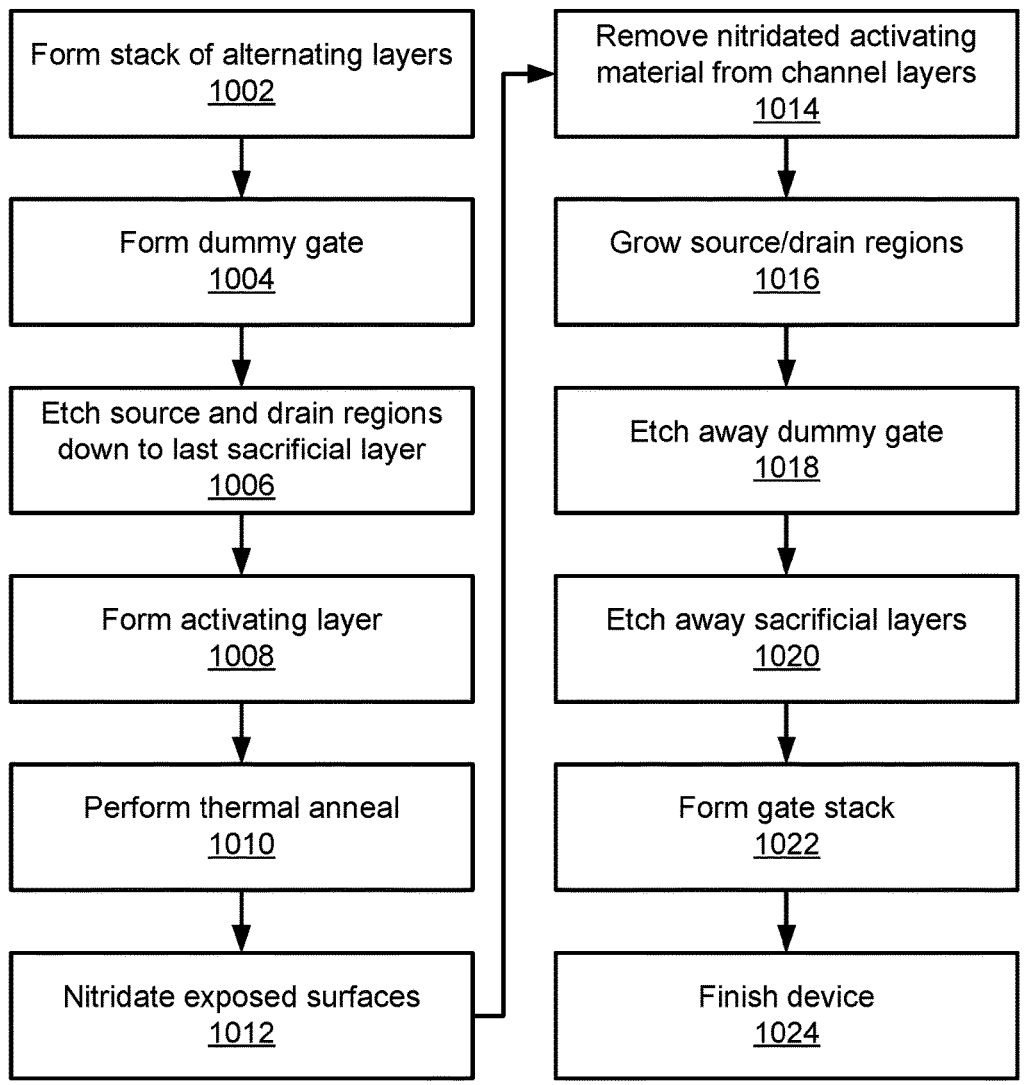
FIG. 10 is a block/flow diagram of a method for forming a gate-all-around FET that inhibits short channel effects in accordance with an embodiment of the present invention.

Referring now to FIG. 10, a method of forming a FET is shown. Block 1002 forms a stack of alternating layers of channel material 104 and sacrificial material 106. It is specifically contemplated that the stack may be divided into different device regions using any appropriate process such as, e.g., shallow trench isolation. Block 1004 forms a dummy gate 202 on the stack and block 1006 anisotropically etches exposed portions of the stack to form recessed source/drain regions 204, leaving a partially etched layer 206 of sacrificial material.

Block 1008 forms a layer of activating material 302 over the exposed sidewalls of the stack of alternating layers. In one specific embodiment, where the layers of channel material 104 are formed from silicon and the layers of sacrificial material are formed from silicon germanium with a 50% germanium concentration, the activating material 302 can be germanium dioxide. Block 1010 performs a thermal anneal, for example raising the device to about 700° C. for about 30 seconds. This anneal causes the activating material 302 to react with the layers of sacrificial material 106. In the example above, where the activating material 302 is formed from germanium dioxide, silicon dioxide structures 402 are formed on the ends of the layers of sacrificial material, and the germanium concentration of the sacrificial material is enriched. This may produce, for example, layers of sacrificial material 406 that have a germanium concentration of about 70%. Block 1012 then nitridates the exposed surfaces, with the silicon dioxide structures 402 being converted to silicon oxynitride inner spacers 502.

Block 1014 removes the remaining nitridated activating material 504 from the channel layers, thereby exposing the side surfaces of the layers of channel material 106. Block 1016 epitaxially grows source/drain regions 602 from the exposed side surfaces of the layers of channel material 106. It is specifically contemplated that the source/drain regions 1016 may be doped in situ and may be trimmed or formed to any appropriate shape and size.

Block 1018 etches away the dummy gate, exposing the layers of channel material 104, suspended by the source/drain regions 602 and the inner spacers 502. Block 1022 forms a gate stack, conformally depositing a gate dielectric layer 802 by any appropriate deposition process such as, e.g., CVD, followed by a gate 804. Block 1024 finishes the device by depositing a passivating inter-layer dielectric 906 and forming electrical gate contacts 902 and source/drain contacts 904.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a stack of vertically aligned semiconductor channel layers above a substrate;
a gate stack formed on, around, and between the vertically aligned semiconductor channel layers;
source and drain structures in contact with respective sidewalls of each of the vertically aligned semiconductor channel layers;
inner spacers positioned between the vertically aligned semiconductor channel layers and in contact with the source and drain structures; and
lower insulating barriers positioned between the substrate and the respective source and drain structures, such that no part of the source and drain structures directly contacts the substrate.

2. The semiconductor device of claim 1, wherein the inner spacers and the lower insulating barriers comprise silicon oxynitride.

3. The semiconductor device of claim 2, wherein the semiconductor channel layers are formed from silicon.

4. The semiconductor device of claim 1, wherein the inner spacers have a rectangular inner face.

5. The semiconductor device of claim 1, wherein each inner spacer has a same thickness.

6. The semiconductor device of claim 1, wherein the lower insulating barriers comprise a horizontal portion formed along a surface of the substrate and a vertical portion formed on sidewalls of the gate stack below a bottommost semiconductor channel layer.

7. The semiconductor device of claim 1, wherein the stack of vertically aligned channel layers comprise a plurality of nanosheets that are vertically separated from one another by about 12 nm.

8. The semiconductor device of claim 1, wherein there is no inner spacer above a topmost channel layer in the stack of vertically aligned semiconductor channel layers.

9. The semiconductor device of claim 1, wherein the lower insulating barriers are further positioned between the gate stack and the respective source/drain structures.

10. The semiconductor device of claim 1, wherein the lower insulating barriers comprise multiple physically separated lower insulating barrier structures.

11. A semiconductor device, comprising:
a stack of vertically aligned silicon channel layers above a substrate;
a gate stack formed on, around, and between the vertically aligned semiconductor channel layers;
source and drain structures in contact with respective sidewalls of each of the vertically aligned semiconductor channel layers;
silicon oxynitride inner spacers positioned between the vertically aligned semiconductor channel layers and in contact with the source and drain structures; and
silicon oxynitride lower insulating barriers positioned between the substrate and the respective source and drain structures, such that no part of the source and drain structures directly contacts the substrate.

12. The semiconductor device of claim 11, wherein the inner spacers have a rectangular inner face.

13. The semiconductor device of claim 11, wherein each inner spacer has a same thickness.

14. The semiconductor device of claim 11, wherein the lower insulating barriers comprise a horizontal portion formed along a surface of the substrate and a vertical portion formed on sidewalls of the gate stack below a bottommost semiconductor channel layer.

15. The semiconductor device of claim 11, wherein there is no inner spacer above a topmost channel layer in the stack of vertically aligned semiconductor channel layers.

16. A semiconductor device, comprising:
a stack of vertically aligned semiconductor channel layers above a substrate;
a gate stack formed on, around, and between the vertically aligned semiconductor channel layers;
source and drain structures epitaxially grown from respective sidewalls of each of the vertically aligned semiconductor channel layers;
inner spacers positioned between the vertically aligned semiconductor channel layers and in contact with the source and drain structures, the inner spacers each having a rectangular inner face and a same thickness; and
lower insulating barriers positioned between the substrate and the respective source and drain structures, such that no part of the source and drain structures contacts the substrate.

17. The semiconductor device of claim 16, wherein the inner spacers and the lower insulating barriers comprise silicon oxynitride.

18. The semiconductor device of claim 17, wherein the semiconductor channel layers are formed from silicon.

19. The semiconductor device of claim 16, wherein the lower insulating barriers comprise a horizontal portion formed along a surface of the substrate and a vertical portion formed on sidewalls of the gate stack below a bottommost semiconductor channel layer.

20. The semiconductor device of claim 16, wherein the stack of vertically aligned channel layers comprise a plurality of nanosheets that are vertically separated from one another by about 12 nm.

* * * * *